US008826250B2

(12) United States Patent
Johnston et al.

(10) Patent No.: US 8,826,250 B2
(45) Date of Patent: Sep. 2, 2014

(54) METHOD FOR JUST-IN-TIME COMPILATION AND EXECUTION OF CODE BLOCKS WITHIN DISCRETE EVENT SIMULATIONS

(75) Inventors: Lenrick Johnston, Berkeley, CA (US); Quint King, San Francisco, CA (US)

(73) Assignee: Bioproduction Group, Berkeley, CA (US)

(*) Notice: Subject to any disclaimer, the term of this patent is extended or adjusted under 35 U.S.C. 154(b) by 590 days.

(21) Appl. No.: 12/828,239

(22) Filed: Jun. 30, 2010

(65) Prior Publication Data

US 2012/0005661 A1 Jan. 5, 2012

(51) Int. Cl.
*G06F 9/445* (2006.01)
*G06F 17/50* (2006.01)
*G06F 9/455* (2006.01)
*G06F 9/45* (2006.01)
*G06F 9/44* (2006.01)
*G06F 9/46* (2006.01)

(52) U.S. Cl.
CPC .............. *G06F 17/5009* (2013.01); *G06F 8/41* (2013.01); *G06F 9/44521* (2013.01); *G06F 17/5022* (2013.01); *G06F 9/4406* (2013.01); *G06F 9/465* (2013.01); *G06F 9/45508* (2013.01)
USPC ........................................................ 717/148

(58) Field of Classification Search
CPC . G06F 9/44508; G06F 9/44521; G06F 9/465; G06F 9/4406; G06F 8/41
USPC ........................................................ 717/148
See application file for complete search history.

(56) References Cited

U.S. PATENT DOCUMENTS

| 5,848,274 | A | * | 12/1998 | Hamby et al. | 717/153 |
| 8,219,378 | B1 | * | 7/2012 | Koh | 703/21 |
| 2005/0114871 | A1 | * | 5/2005 | Wolff et al. | 719/331 |
| 2008/0005719 | A1 | * | 1/2008 | Morris | 717/100 |
| 2010/0017185 | A1 | * | 1/2010 | Bade et al. | 703/13 |
| 2011/0067017 | A1 | * | 3/2011 | Ghosh-Roy et al. | 717/155 |

* cited by examiner

*Primary Examiner* — Jonathan C Teixeira Moffat
*Assistant Examiner* — Lynda Dinh
(74) *Attorney, Agent, or Firm* — Temmerman Law Office; Mathew J. Temmerman (57) ABSTRACT

A method for a discrete event simulation model of a system utilizing a just-in-time compilation for one or more code blocks associated with an event in one or more discrete event simulation models is disclosed. The method comprises the steps of determining the event in a discrete event simulation model, retrieving the code block associated with the event, compiling the code block into an object file using a compiler, linking the object file with a predetermined function in a simulation library, compiling the object file and the predetermined function into a customized dynamic link library, loading the customized dynamic link library (DLL) within a discrete event simulation program execution and linking the customized DLL to a simulation program. The method allows user entered logic to be executed in high speed by integrating a just-in-time compiler embedded into the discrete event simulation model to allow dynamic generation of high speed code blocks within one or more simulations.

15 Claims, 7 Drawing Sheets

METHOD FOR JUST-IN-TIME COMPILATION AND EXECUTION OF CODE BLOCKS WITHIN DISCRETE EVENT SIMULATIONS

BACKGROUND OF THE INVENTION

1. Field of the Invention

The present invention relates in general to a method for increasing the execution speed of discrete event simulations. More specifically, the present invention relates to a method for executing at least one discrete event simulation model in high speed by integrating a just-in-time compiler embedded into the discrete event simulation model to allow the dynamic execution of high speed code blocks associated with one or more events within the discrete event simulation.

2. Background

Discrete event simulations are a common method of modeling real-world processes having a number of different activities and involving one or a number of resources. Discrete event simulations create a mathematical model of a system and use a series of state variables to track the evolution of that system over time. The advantage of such discrete event simulations is that they provide a method to test scenarios in a computer environment before implementing changes in a real-world setting.

Discrete event simulations face a number of challenges to ensure the execution of large or complex simulations in a timely manner. One of the most significant challenges is the need to incorporate any number of user-specific conditions and state changes into the simulation. These user-specific conditions can have any form and are often quite complex. Current simulation frameworks typically allow a subset of these conditions and changes to be made using a graphical user interface (GUI). However, no matter how general or complex the GUI, there are inevitably shortcomings with the simulation frameworks and the user is sometimes faced with the need to add customized 'code' or logic to the simulation. An example is the need to differentiate a complex function (say, integrating a function numerically at a particular point) in order to determine whether an event in the simulation should be scheduled. GUIs do not typically incorporate such functions, since such complex mathematics would only be present in a comprehensive math modeling language. This means that simulations generated using a GUI alone is not representative of the system being modeled.

In order to allow for such logic, discrete event simulation languages sometimes incorporate user-specific 'code' programmed in an existing programming language (Visual Basic, Java etc) that may incorporate the execution of a simulation within the scope of such code. They sometimes also embed the simulation within the scope of some other custom code that can perform calculations outside the scope of the simulation. For example, U.S. Pat. No. 7,624,383 issued to Barr on Nov. 24, 2009 provides a system and method that allows the embedding of simulation primitives within a conventional programming language in order to use the full capabilities of the conventional programming language and its compiler without modification in the programming of efficient, scalable simulators. However, this method does not possess the ability to embed custom source code inside a simulation program—only to embed a simulation inside custom source code. It does not, for example, allow differentiation to be part of the simulation execution. Moreover, it does not have to 'just-in-time' compile and link the custom functions to the execution of the simulation.

U.S. Pat. No. 5,828,867 issued to Pennell on Oct. 27, 1998 describes a method for re-configuring a pre-compiled discrete-event digital simulation program. The method comprises steps for creating a template having a series of generic tasks and incorporating the template onto a computer to create a generic computer simulation. Even so, the method cannot include all of the possible kinds of events and logics in a real-world simulation. Further, once the template is defined for a particular industry or problem, it cannot be customized without a complex process to re-establish a new template. This approach therefore suffers from the same problems described with GUIs.

U.S. Pat. No. 5,701,439 issued to James on Oct. 23, 1997 provides a combined discrete-event and continuous model simulation and analysis tool. The objective in developing this simulation tool is to provide a uniform simulation platform appropriate for all combinations of simulation model requirements, language implementations, and host processor types. However, this approach does not incorporate any number of user-specific conditions and state changes, as described in the limitations above. Furthermore, this approach uses manual compilation steps, rather than 'just-in-time' compilation that results in a slow simulation execution speed. Finally, the approach only allows a limited architecture for simulation models to communicate with each other.

Similarly, in some other methods, the low execution speed of user-specific 'code' is due to the different language of that code from the simulation program causing the code to be interpreted rather than pre-compiled. Since the interpreted languages are not directly executed by the central processing unit (CPU) but by an interpreter, such methods result in a much slower speed of simulation program execution compared to direct machine code execution on the host CPU.

Hence, it can be seen, that there is a need for a method that would use an effective compilation technique that allows user-entered logic to be executed in high speed and be completely customizable such that any condition or logic can be entered within the scope of the events in the simulation. Further, the needed method would include the ability to incorporate any number of user-specific conditions and state changes. Moreover, the method would include all of the possible types of events and logic in a real-world simulation.

SUMMARY OF THE INVENTION

To minimize the limitations found in the prior art, and to minimize other limitations that will be apparent upon the reading of the specification, the present invention provides a method for a discrete event simulation model of a system utilizing a just-in-time compilation technique for at least one code block associated with at least one event in the discrete event simulation model, the method comprising the steps of determining the event in a discrete event simulation model, retrieving the text of the code block associated with the event, compiling the code block into an object file (OBJ) using a compiler, linking the object file with at least one predetermined function in a simulation library (LIB), compiling the object file and the predetermined function into a customized dynamic link library (DLL), loading the customized dynamic link library within a discrete event simulation program execution and linking the customized dynamic link library to the simulation program associated to the system. The user entered logic is executed in high speed by integrating a just-in-time compiler embedded into the discrete event simulation model to allow the dynamic generation of high speed code blocks associated with the at least one event. The at least one user-entered logic is defined as a set of user-entered text that refer to system states and future events list including a list of pending activities, a history of previously executed events or a previous system state at a previous moment of execution.

Another aspect of the present invention is a method for integrating at least one code block associated with at least one event into a discrete event simulation model of a system, the method comprising the steps of initializing a simulation program and retrieving a first event, scheduling the first event and passing the type of the first event, k, for subsequent processing, receiving the type of the first event and checking the necessity of just-in-time compilation of the first event of the type, k, compiling the first event if the just-in-time compilation is necessary and running the at least one code block, performing a check to determine whether a simulation program is over, and writing outputs by the simulation program if the simulation program is over or retrieving a next event and the type of the event, k, from a future events list, advancing a clock variable to a time of the next event and repeating steps from the step receiving the type of the first event and checking the necessity of just-in-time compilation of the first event of the type, k, if the simulation program is not over.

It is thus a first objective of the invention to provide a method of integrating a plurality of customized logic functions within a discrete event simulation model.

A second objective of the invention is to provide a plurality of customized logic functions having the ability to model any calculation using arbitrary data, including data relevant to the discrete event simulation being executed.

A third objective of the invention is to provide a method that creates a simulation to allow any feasible physical or logical event and associated logic to be correctly modeled.

A fourth objective of the invention is to provide a method to execute a plurality of customized logic functions that allows high speed execution of the simulation program, if an equivalent calculation is available within the existing simulation framework.

A fifth objective of the invention is to provide a method that allows the simulation to be seen as a meta-language that can control the execution of a series of custom functions according to a set of pre-defined criteria.

A sixth objective of the invention is to provide a method that can be re-used in multiple simulations or in simultaneously executing semi-independent, loosely linked or indirectly related simulations.

A seventh objective of the invention is to provide a method that uses in-line compilation steps that are transparent to a user.

An eighth objective of the invention is to provide a plurality of customized logic functions that are compiled and linked to an existing simulation code, as the simulation is executed.

A ninth objective of the invention to provide a plurality of customized logic functions that can be applied to any element of the simulation including, but not limited to, the current state of objects within the simulation, the execution of future items on the events list, activity durations, and future state of objects within the simulation at the execution of any discrete event.

These and other advantages and features of the present invention are described with specificity so as to make the present invention understandable to one of ordinary skill in the art.

BRIEF DESCRIPTION OF THE DRAWINGS

Elements in the figures have not necessarily been drawn to scale in order to enhance their clarity and improve understanding of these various elements and embodiments of the invention. Furthermore, elements that are known to be common and well understood to those in the industry are not depicted in order to provide a clear view of the various embodiments of the invention, thus the drawings are generalized in form in the interest of clarity and conciseness.

DETAILED DESCRIPTION OF THE INVENTION

In the following discussion that addresses a number of embodiments and applications of the present invention, reference is made to the accompanying drawings that form a part hereof, and in which is shown by way of illustration specific embodiments in which the invention may be practiced. It is to be understood that other embodiments may be utilized and changes may be made without departing from the scope of the present invention.

Various inventive features are described below that can each be used independently of one another or in combination with other features. However, any single inventive feature may not address any of the problems discussed above or only address one of the problems discussed above. Further, one or more of the problems discussed above may not be fully addressed by any of the features described below.

Figure 1:
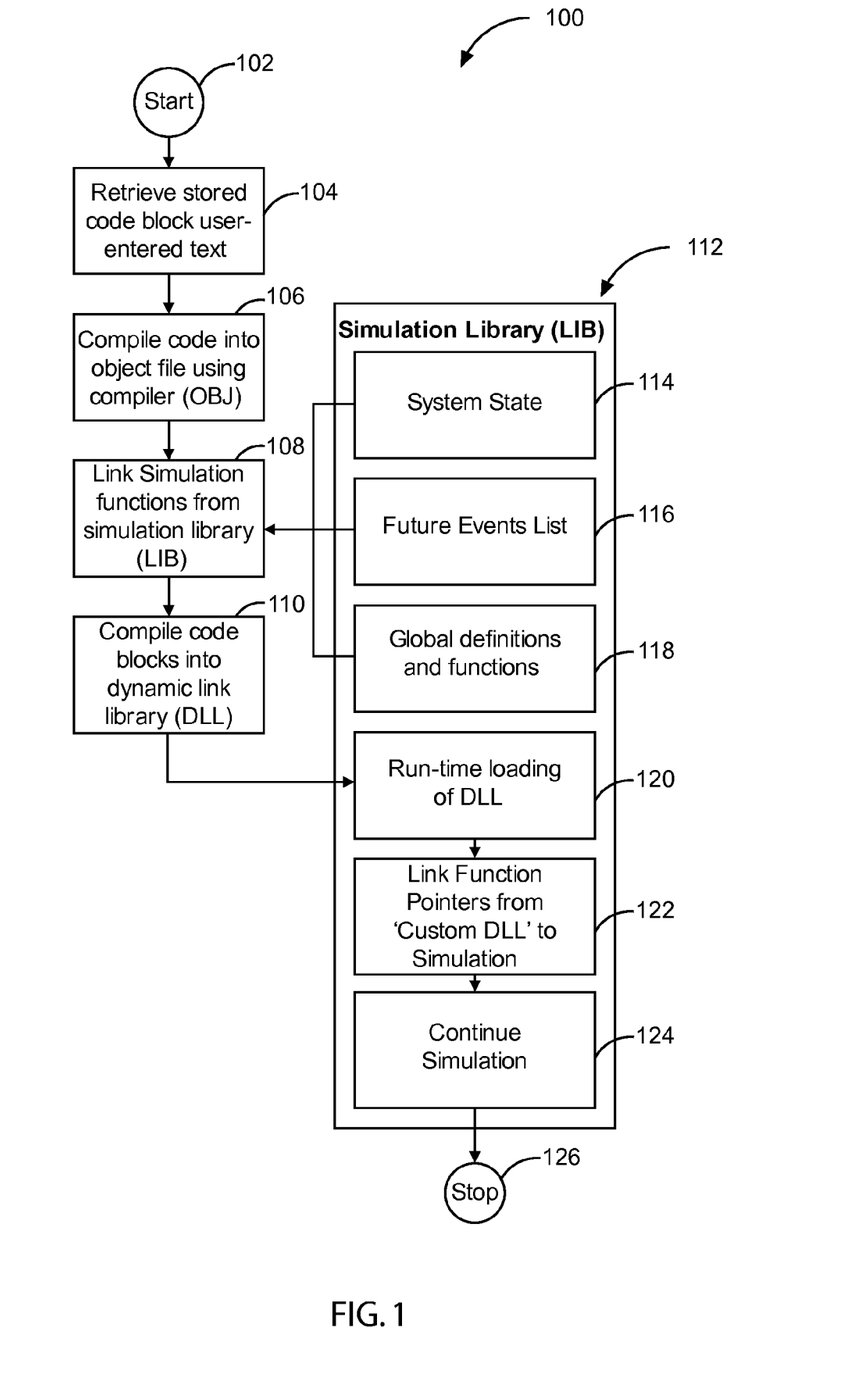
FIG. 1 is an operational flowchart illustrating a method for discrete event simulation model of a system utilizing a just-in-time compilation for at least one code block associated with at least one event in the discrete event simulation model.

FIG. 1 is an operational flowchart illustrating a method for just-in-time compilation of at least one code block associated with at least one event in a discrete event simulation model 100. Initiation of the discrete event simulation model 100 is based on a signal from the currently executing simulation that this method is necessary; the number of unique event type 'k' in the model determines the number of possible custom code blocks that will be compiled for the discrete event simulation model. Taking as an example the dynamics of a typical carwash, it should be understood that there are typically a number of different types of events: 'arrivals' corresponding to the event that a car arrives to the carwash, 'start service' corresponding to the event that a car begins to be washed, 'end service' corresponding to the event that a car ends being washed, and 'exit' corresponding to the event that a car exits the carwash. Each type of event has a common logic framework associated with it. For example, a 'start service' event decrements the number of available carwashes by 1, decrements the number of waiting cars by 1, and increments the number of cars being washed by 1. This event will also generate the future event 'end service' at some future point in time. Since every event in the simulation may be a unique type of event, a 'type' of event is classified accordingly. Note that each event in the simulation may itself be a 'type' of event. In addition, each instance of an event in the simulation may itself be a 'type' of event. The simulation designer is assumed to have entered code blocks for each type of event in the simulation, and this code block text is available for each code block type before the execution of method 100.

Thereafter, the method is initiated as indicated at block 102. Further, the method 100 includes the steps of: retrieving the at least one code block (that is, one or more) associated with the at least one event as shown in block 104, compiling the code block into an object file (OBJ) using a compiler as shown in block 106, linking the object file with at least one predetermined function in a simulation library (LIB) 112 as shown in block 108, compiling the object file and the predetermined functions into a customized dynamic link library (DLL) as shown in block 110, loading the customized dynamic link library within the discrete event simulation program execution as shown in block 120 and linking the customized dynamic link library to the simulation program associated to the system as shown in block 122.

A user-entered logic is executed in high speed by integrating a just-in-time compiler embedded into the simulation model to allow dynamic generation of high-speed code blocks associated with the events. The user-entered logic is defined as a set of user-entered text that refers to system states and future events list. For each type of the event, a custom section of code text is encapsulated inside a single function and compiled by the compiler to a memory location to define the compiled code block.

The code block is written in a programming language that is understandable to the user, and may include any of the many programming languages currently available on the commercial market. The code block has access, through global variables and the simulation library 112, to the system states, the future events list and properties of those future events, other code blocks and a plurality of standard code libraries. Examples of standard code libraries include any number of non-simulation-specific logic, including (but not limited to) math, statistical, logical and other functions.

The set of user entered text describes logic or calculations to be performed as part of the at least one event. The set of user-entered text is written in a programming language. The set of user-entered text may refer to the system states including the status of current resident or transient entities in the discrete event simulation by means of a syntax that is a part of the discrete event simulation. The set of user-entered text may also refer to the future events list including a list of pending activities, a history of previously executed events or a previous system state at a previous moment of execution. The set of user-entered text may include any reference to data storage or other data that is independent of, or part of the simulation including current simulation time, stopping conditions of the discrete event simulation, and any other features of the discrete event simulation.

The step of compiling the code block into the object file using the compiler converts the custom section of code entered by the user into a series of named sequences of machine code, the compiler being adaptable to recognize the syntax of the user entered text. Each of these named sequences, or functions, is given a unique name and memory location to distinguish it from other code blocks in the simulation. The object file may include a series of sequences performing a plurality of common tasks or other common elements that are re-used. The series of sequences may be used by other code blocks in other sections of compiled code. To illustrate an example, one function in the code block may include a series of checks that determine the maximum value of a series of numbers. When numbers are passed, for example 5, 6, 7 to the code block, the maximum of those numbers, in this case, '7', will be returned. This function can then be used repeatedly by other functions inside this code block. This function may also be accessible to other code blocks in the simulation program.

As shown in block 112, the object file is linked with the predetermined functions in a simulation library. The predetermined functions represent the entire collection of information generated within the discrete event simulation model including the system states as shown in block 114, and/or the future events list as shown in block 116. The predetermined function also represents parameters defining the simulation and other global functions as shown in block 118 including changing simulation time, scheduling future events and performing reporting functions. The simulation library as shown in block 112 can therefore be seen as the core set of functions that define a simulation and allow the user-defined functions to access various aspects of the simulation data.

The customized dynamic link library is a programming object that can be loaded at run time or during the course of the execution of the simulation program. The simulation is linked, or re-linked as the simulation progresses to the customized dynamic link library containing the customized code blocks as shown in block 122. The various user-defined functions may be referenced by the function pointers and are linked to the main simulation program, one for each type of event k. This allows the discrete-event simulation program to execute a particular function (located at a particular block of memory) when that particular type of event occurs. The memory location of the functions can be defined in the main program using a sparse array of function pointers to speed lookup. These function pointers are then used within the simulation program by performing a lookup of this sparse array of function pointers, when a particular function is requested. The code relating to the memory location is then executed by the simulation as necessary within the scope of the simulation itself, including any custom code inside the dynamic library 110. This assumes that the simulation process and custom code blocks are written in compatible languages, i.e., that functions in a dynamic link library using the custom code block will be accessible to the executable running simulation process as shown in block 124. Continuing the simulation completes the just-in-time compilation process as shown in block 126.

Figure 2:
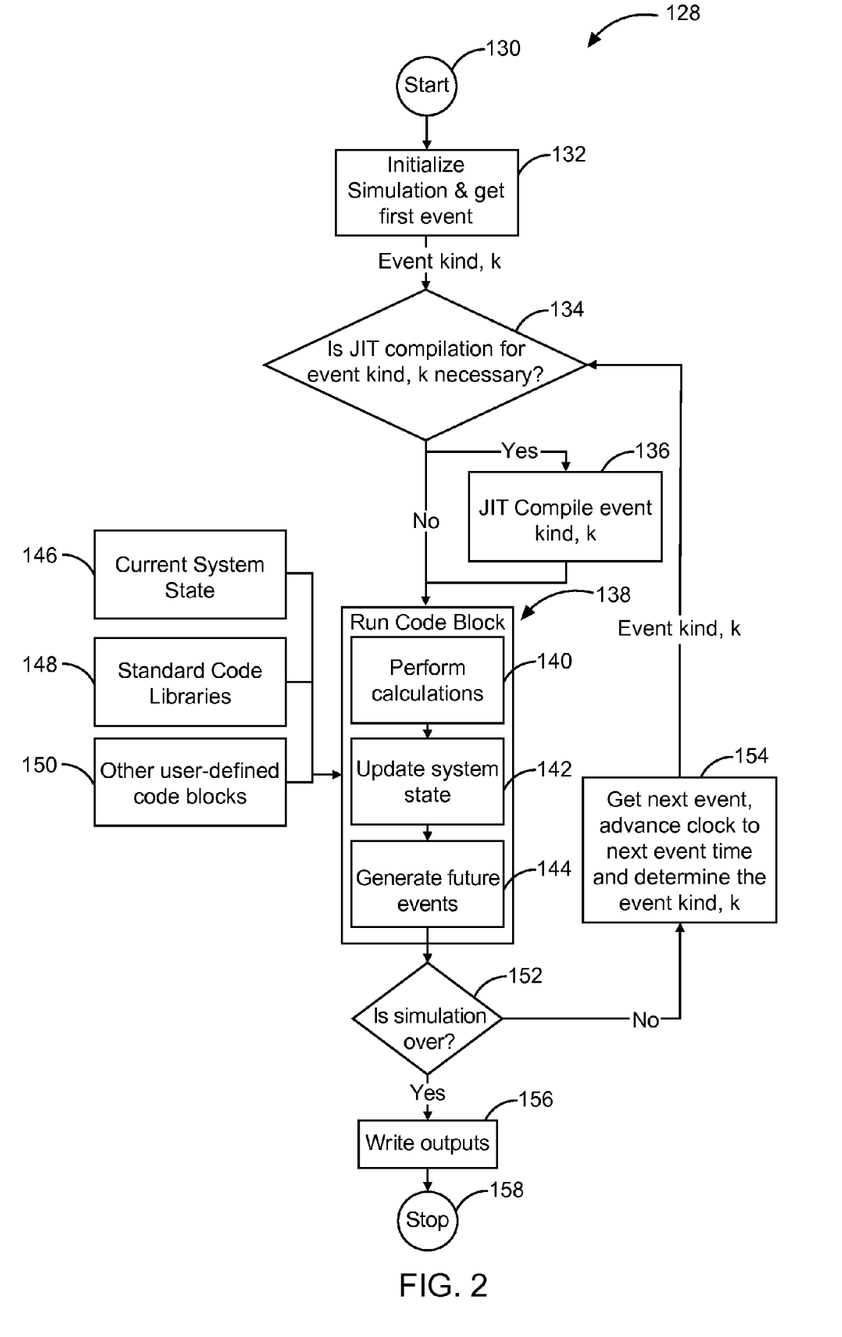
FIG. 2 is an operational flowchart illustrating a method for integrating the at least one code block associated with the at least one event into the discrete event simulation model of the system.

Referring to FIG. 2, another aspect of the method for integrating the just-in-time compilation process described in FIG. 1 into a generic discrete event simulation model 128 is illustrated. This assumes that there is at least one code block associated with at least one event in the discrete event simulation model, otherwise FIG. 1 represents a generic model. The method may be initiated as indicated at block 130. The method comprises the steps of initializing the simulation program, a function that sets initial states of the entities in the simulation and adds events to the future events list, and retrieving a first event in the simulation as indicated at block 132, scheduling the first event and passing the first event and event type 'k' for subsequent processing to the block 134 where the necessity of just-in-compilation of the first event of the type, k, is evaluated. Typically, the first time the simulation runs a particular piece of logic, or code block, compilation and linking of that code block is required using the just-in-time compiler. On subsequent events of the same event type, k, re-compilation is typically not necessary. The execution of the first event may also trigger the recompilation of a plurality of code blocks. The execution of subsequent events in later time periods or during later events may also trigger the re-compilation of one or more code blocks. If recompilation is required, the event of type 'k' is compiled as indicated at block 136 and by the process previously described in FIG. 1 and dynamically linked to the simulation program.

Depending on the type of event generated, the currently compiled code block executes as indicated at block 138. These may be based on a number of possible inputs. The first possible input is the current state of the discrete-event simulation ('current system state') as depicted at block 146, including but not limited to the history of previous events executed, future events scheduled, current time, or the state of any resident or transient entities in the system, user-defined arrays of data, and the current random number seed. The second possible input is any 'standard libraries' as depicted at block 148, including but not limited to math, statistical, logic, graphics or other programming language libraries common to compiled code. These may include user-defined programming language libraries that are dynamically linked to the simulation. The third possible input is other user-defined code blocks as in block 150, which may be executed within the context of an existing code block in a serial or recursive manner.

Within the context of code block execution, the code block may perform calculations as indicated at block 140 or may update the system state as indicated at block 142 as per the specifics of the code entered by the user. This includes all common operations common to discrete-event simulations, including but not limited to changing the state of resident or transient entities in the system, saving data, updating the current clock time, or updating the random seed. Within the context of code block execution, the code block may generate future events as indicated at block 144. Event generation explicitly depends on the execution of the code block, so that according to the conditions and logic in the code block a series of future events may or may not be scheduled. Note that the order of execution of items 140, 142 and 144 may be in any order, recursive, or there may be multiple instances of each item within the code block 138 depending on the specifics of the code entered by the user. Next, a check is performed as at block 152 to determine whether the simulation program is over. If the simulation program is not over, a next event and the type of the event, k, is retrieved from the future events list and advances a clock variable to a time of the next event as indicated at block 154 and the control is passed to block 134 for further steps. If the simulation program is over, the outputs will be written as at block 156 and the process is terminated as shown in block 158.

Returning to a previous example, a single carwash facility that is only open between the hours of 8:00 am and 12:00 pm is demonstrated to exemplify the method illustrated in FIG. 2. The carwash has four types of events—'arrival', an event that occurs at the moment when a single car has arrived to the carwash, a 'start carwash' event occurring at the start of the carwash (requiring both a carwash and a car to start), and a 'finish carwash' event indicating the end of the carwash and releasing both a clean car and the carwash for another task. If cars arrive and the carwash is closed, the cars leave without being washed. The simulation is assumed to start at 8:00 am with no cars waiting, and cars arrive randomly, between 0 and 3 hours apart. The carwash itself takes 20 minutes, so if a car arrives while the carwash is busy, it waits for service.

One possible sequence of events that describes the method explained in FIG. 2 is described in Table 1, below:

| Time | Description |
| --- | --- |
| 8:00 am | Initialize simulation and retrieve first event: the simulation is initialized with one open carwash, the time is initialized to 8:00 am, and the first car's arrival is randomly chosen to be at 8:03 am and scheduled on the future events list. No further code is executed. |
| 8:03 am | JIT Compilation (optional): the next scheduled event is the arrival event at 8:03 am; the clock advances to 8:03 am. The event type 'Arrival' has not been compiled and is compiled at this time. |
| 8:03 am | Run Code Block 'Arrive': the code block execution increments the number of cars waiting by one, and calculates that 8:03 am is between 8 am and 12 pm, therefore the carwash is open. (This may include using a standard library to translate the simulation time to the current hour and minute of the day.) The carwash is currently empty; therefore the 'arrive' code block schedules a future event at 8:03 am to start the carwash process. The next arrival event is scheduled to occur at 8:59 am. The clock does not advance as the next event ('start carwash') is at the same time. |
| 8:03 am | JIT Compilation (optional): the next scheduled event is the 'start carwash' event at 8:03 am; the event type 'start carwash' has not been compiled and is compiled at this time. |
| 8:03 am | Run Code Block 'Start Carwash': the code block execution decrements the number of cars waiting by one, the number of available carwash machines by one, and schedules an 'end carwash' event at 8:23 am. The clock is advanced to the next event. |
| 8:23 am | JIT Compilation (optional): the next scheduled event is the 'end carwash' event at 8:03 am; the event type 'end carwash' has not been compiled and is compiled at this time. |
| 8:23 am | Run Code Block 'End Carwash': the code block execution increments the number of clean cars by one, and increments the number of available carwash machines by one. No further cars are waiting so no other events are scheduled. The clock is advanced to the next event. |
| 8:59 am | JIT Compilation (optional): the next scheduled event is the 'arrival' event at 8:59 am; the event type has already been compiled and is not recompiled. |
| 8:59 am | Run Code Block 'Arrive': the code block execution increments the number of cars waiting by one, and calculates that 8:59 am is between 8:00 am and 12:00 pm, therefore the carwash is open. The carwash is currently empty; therefore the 'arrive' code block schedules a future event at 8:59 am to start the carwash process. The next arrival event is scheduled to occur at 12:35 pm. |
| 8:59 am | JIT Compilation (optional): the next scheduled event is the 'start carwash' event; the event type 'start carwash' has already been compiled and is not recompiled. |
| 8:59 am | Run Code Block 'Start Carwash': the code block execution decrements the number of cars waiting by one, the number of available carwash machines by one, and schedules a 'end carwash' event at 9:29 am. The clock is advanced to the next event. |
| 9:29 am | Run Code Block 'End Carwash': the code block execution increments the number of clean cars by one, and also increments the number of available carwash machines by one. No further cars are waiting; therefore no other events are scheduled. The clock is advanced to the next event. |
| 12:35 pm | JIT Compilation (optional): the next scheduled event is the 'arrival' event; the event type has already been compiled and is not recompiled. |
| 12:35 pm | Run Code Block 'Arrive': the code block execution increments the number of cars waiting by one, and calculates that 12:35 pm: is not between 8:00 am and 12:00 pm, therefore the carwash is closed. The number of cars left unwashed is incremented by one; the 'start carwash' event is not scheduled. The next arrival event is scheduled to occur at 3:22 pm. |

As can be seen from the example above, the execution logic for a simulation incorporating just-in-time compilation is demonstrated which resulted in a determination of possible future events that should be executed, and their scheduling on the future events list. Primarily, upon first execution of a particular event type, the code block relating to that event type is compiled and linked to the existing simulation using a process described later. Also, rather than an event having pre-determined logic that updates the system state and generates future events, these tasks are handled within the context of the code block. In the example given, this resulted in a determination of which possible future events should be executed, and their scheduling on the future events list. Such an approach allows complete flexibility for any type of logic to be incorporated in the discrete-event simulation with each code block containing logic compiled only as it is required.

Figure 3:
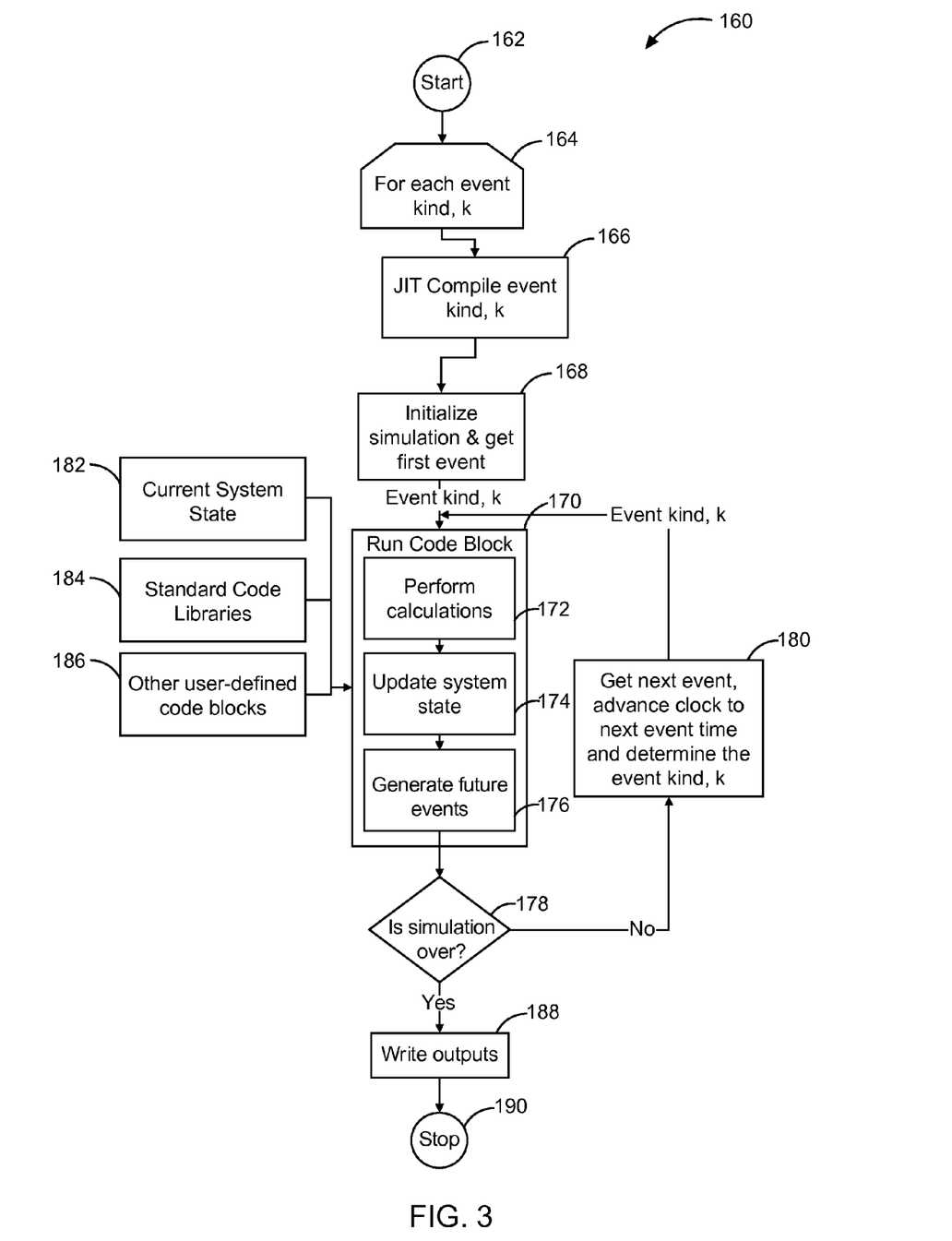
FIG. 3 is an operational flowchart illustrating an extension to the flowchart of FIG. 2.

FIG. 3 is an operational flowchart illustrating an extension to the flowchart of FIG. 2. This flowchart represents a simulation model 160 for single compilation of all event types at runtime. The algorithm utilized in this model 160 calls for each event type to be compiled and linked to the simulation program before the time that the event type is first used. This extension differs from the flowchart shown in FIG. 2 by compiling all possible events at the start of the simulation run, simplifying the just-in-time compilation process.

The method may be initiated as indicated at block 162. The method comprises the steps of passing the type of the event, k, for subsequent processing as shown in block 164, compiling of each event of the type, k, as shown in block 166 and then the simulation is initialized as shown in block 168. When calling the next event, there is no need to check whether the event of the type, k, has already been compiled since all event types have been compiled in block 164 and 166. The initialization of the simulation program includes the function that sets initial states of the entities in the simulation, adding events to the future events lists, and retrieving first event in the simulation. The event of type 'k' is scheduled and passed to the block 170 where the currently compiled code block is executed depending on the type of event generated and a number of calculations performed. These may be based on a number of possible inputs.

The first possible input is the current state of the discrete-event simulation ('current system state') as depicted at block 182—including but not limited to the history of previous events executed, future events scheduled, current time, or the state of any resident or transient entities in the system, user-defined arrays of data, and the current random number seeds. The second possible input is any 'standard libraries' as depicted at block 184 including, but not limited to, math, statistical, logic, graphics or other programming language libraries common to compiled code. These may include user-defined programming language libraries that are dynamically linked to the simulation. The third possible input is other user-defined code blocks as in block 186, which may be executed within the context of an existing code block in a serial or recursive manner.

Within the context of code block execution, the code block may perform calculations, and update the system state as indicated at block 174. This includes all common discrete-event simulation operations, including the changing the state of resident or transient entities in the system, saving data, updating the current clock time, or updating the random seed. Within the context of code block execution, the code block may generate future events as indicated at block 176. Event generation explicitly depends on the execution of the code block, so that according to the conditions and logic in the code block, the series of future events may (or may not) be scheduled. Note that the order of execution of items 172, 174 and 176 may be in any order, recursive, or there may be multiple instances of each item within the code block 170.

Next, a check is being performed at block 178 to determine whether the simulation program is over. If the simulation program is not over, a next event and the type of the event, k, is retrieved from the future events list, a clock variable is advanced to the time of the next event as indicated at block 180 and the control is passed to block 170 for further steps. The simulation continues until the stopping criteria are met. Once the simulation program is over, the outputs will be written as at block 188 and the process is terminated as shown in block 190. This extension of the method assumes that each code block only needs to be recompiled once within the scope of the simulation program. This approach may allow faster code execution since all compilation steps can be done before the simulation program starts. This method is therefore appropriate for cases where the code block text is true for all possible conditions in the simulation, at all times during the course of the entire simulation.

Figure 4A:
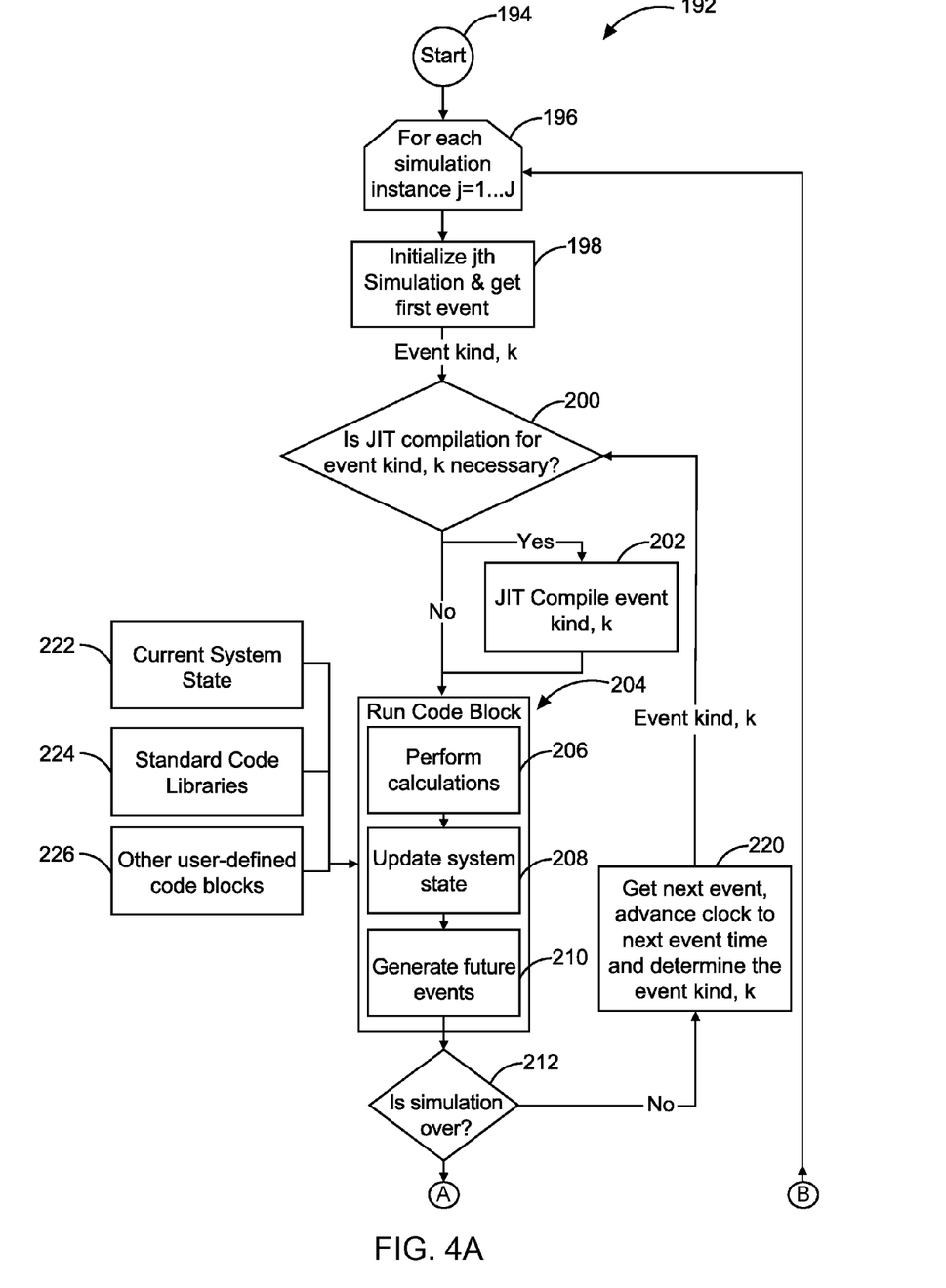
FIG. 4 is an operational flowchart illustrating an extension to the flowchart of FIG. 2.
Figure 4B:
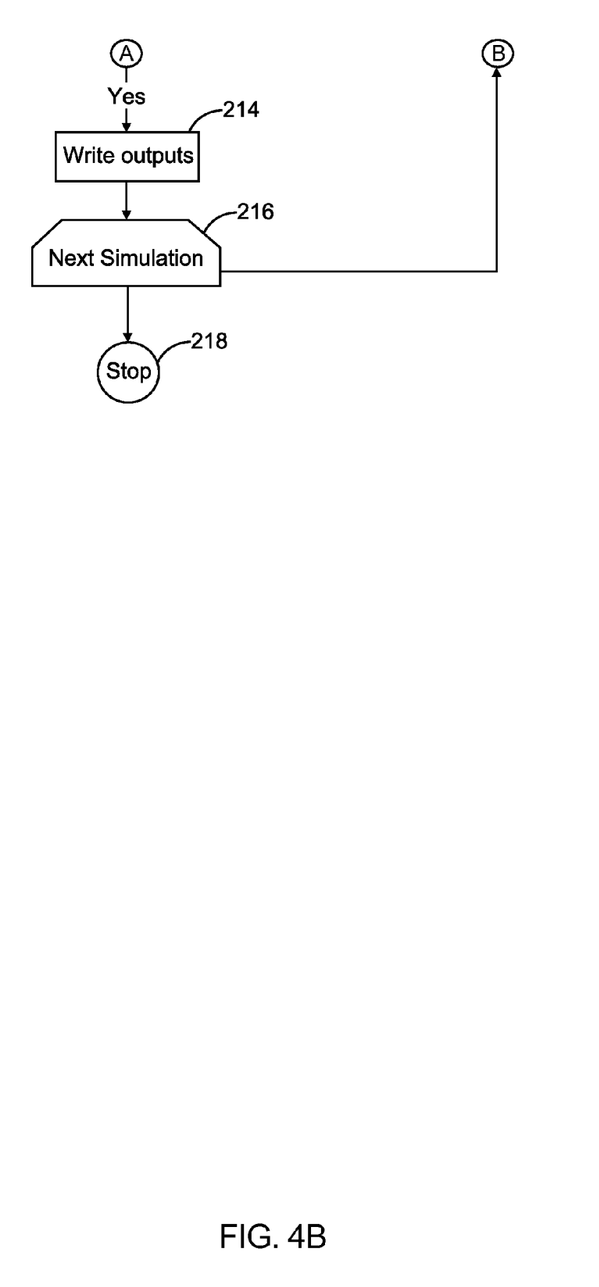

FIG. 4 is an operational flowchart illustrating an extension to the flowchart of FIG. 2. This flowchart represents a method for the re-use of existing pre-compiled code blocks across multiple simulations or simulation instances 192 that may or may not share event types k. The method may be initiated as indicated at block 194. Referring to the FIG. 4, the process flow described in FIG. 2 is encapsulated inside the simulation model so that a loop iterates over each of J simulation instances, j=1 . . . J as indicated at block 196. The code blocks are stored in a common memory, so that the list of event types k=1 . . . K is the union of all the event types across all simulation instances. This allows simulations to have their own unique code blocks, and to possibly share code blocks between simulations.

At block 198, the initialization of the simulation program and the retrieval of first event in the simulation program are indicated. The first event is scheduled and the type of the first event, k, is passed for subsequent processing to the block 200 where the need for just in time compilation of the first event of the type, k, is evaluated. (Typically, the first time the simulation runs a particular piece of logic, or code block type k, compilation of that logic is required. On subsequent events of the same event type k, re-compilation is not typically necessary.) The execution of events may also trigger the re-compilation of a particular code block. If recompilation is required, event of type k is compiled as indicated at block 202 and dynamically linked to the simulation program.

Depending on the type of event generated, the currently compiled code block executes as indicated at block 204, performing a number of calculations as at 206. These may be based on a number of possible inputs. The first possible input is the current state of the discrete-event simulation ('current system state') as depicted at block 222—including but not limited to the history of previous events executed, future events scheduled, current time, or the state of any resident or transient entities in the system, user-defined arrays of data, and the current random number seed. The second possible input is any 'standard libraries' as depicted at block 224—including but not limited to math, statistical, logic, graphics or other programming language libraries common to compiled code. These may include user-defined programming language libraries that are dynamically linked to the simulation. The third possible input is other user-defined code blocks as in block 226, which may be executed within the context of an existing code block in a serial or recursive manner.

Within the context of code block execution, the code block may update the system state as indicated at block 208. This includes all common discrete-event simulation operations, including changing the state of resident or transient entities in the system, saving data, updating the current clock time, or updating the random seed. Within the context of code block execution, the code block may generate future events as indicated at block 210. Event generation explicitly depends on the execution of the code block, so that according to the conditions and logic in the code block a series of future events may (or may not) be scheduled. Note that the order of execution of items 206, 208 and 210 may be in any order, or there may be multiple instances of each item within the code block 204.

Next, a check is performed as at block 212 to determine whether the simulation program is over. If the simulation program is not over, a next event and the type of the event, k, is retrieved from the future events list, a clock variable is advanced to a time of the next event as indicated at block 220 and control of the simulation is passed to block 200 for further steps. If the simulation program for the current simulation instance is over, the outputs will be written as at block 214 and a subsequent replication j of the simulation will be initiated as at block 216 and the control is passed to block 196 for updating the simulation instance for the selected type of event. Finally, after replications j=1 . . . J have completed the process is terminated as shown in block 218.

In this case, shared functions that have previously compiled code block can be re-used for the simulation. An example of such code block re-use is running multiple replications of a single experiment each with a different random seed, in order to examine the way in which randomness or variability affect the outcome of the simulation program. In this case, the code blocks for each event have to be compiled only once in the first iteration of the simulation program, since subsequent replications of the same simulation with different random seeds can use the same compiled code blocks. This considerably increases the speed of simulation execution since recompilation of code blocks is associated with some processor and time overhead.

An example of such a simulation is depicted by way of the flowchart in FIG. 4 and continuing the example of the carwash illustrated previously. Using this example, two simulations can be performed: one of a carwash that is always open, and another of a carwash that only opens on Saturday and Sunday. In the first simulation, assume there are three unique code blocks, one for each event type—arrivals, start carwash, and end carwash (K=3). Each of these code blocks is associated with a particular type of event—for example, the arrivals event increments the number of waiting cars by one and schedules another arrival on the future events list. Assuming the second carwash is similar to the first except for its opening hours, the only event type that is different is the start carwash event. This is because arrivals will still occur in the same pattern, whether or not the carwash is open or closed, but since the second carwash is only open on weekends the start carwash event requires an additional check to ensure it is open before starting service. The end carwash event is also the same across both simulations, since on completing the carwash cars always exit both carwashes the same way. Therefore, three unique code blocks are required for the first simulation, but only one unique code block is required in addition to the existing three code blocks for the second simulation. Thus across both of these simulations, there are a total of 4 code blocks—whereas running each separately would require a total of 6 code blocks.

Figure 5A:
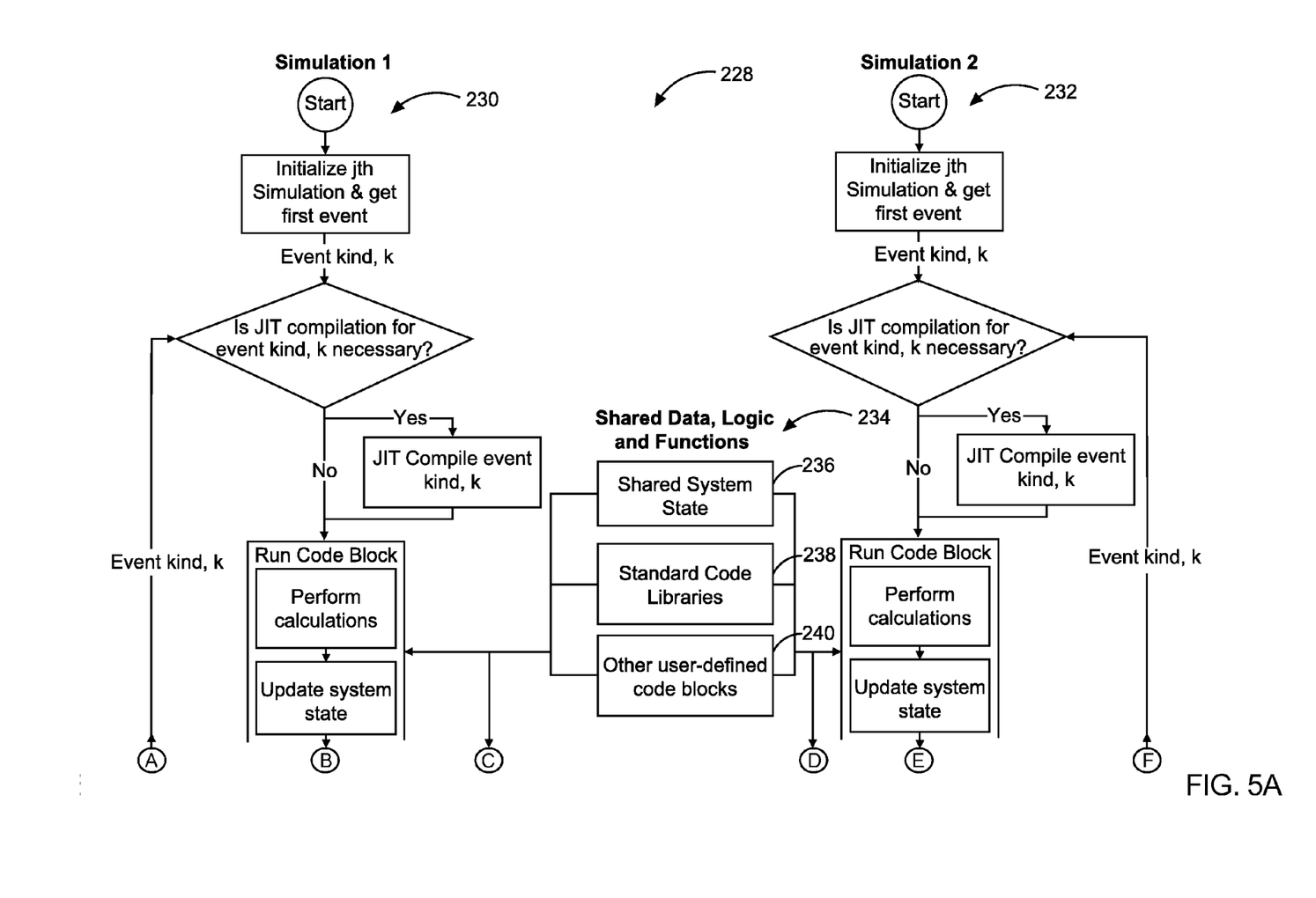
FIG. 5 is an operational flowchart for modeling a plurality of simulations that are loosely linked and indirectly related to one another.
Figure 5B:
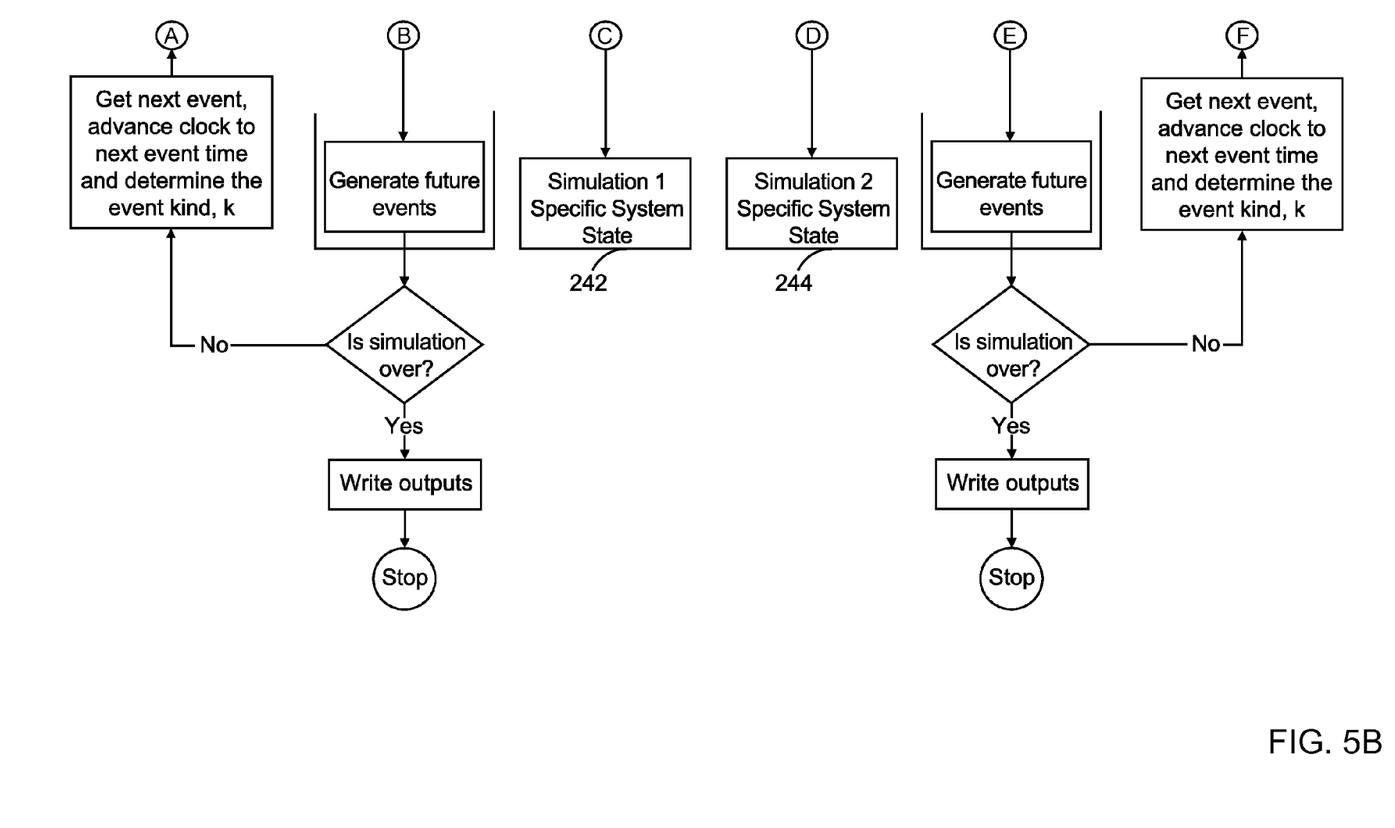

FIG. 5 is an operational flowchart for modeling a plurality of simulations that are loosely linked and indirectly related to one another 228. Unlike the extension shown in FIG. 4 the simulations are not directly related—for example, are not both the same carwash with slightly different operating rules—but share some common elements—for example, two businesses both operating in the same city. This flowchart represents a method to link disparate simulation instances 230, 232 together into a single common simulation that shares one or more resident or transient entities, functions or other common data. The simulations may also be entirely unrelated but may be executed at the same time.

The method illustrated in FIG. 5 shows the design of two loosely linked simulations, 'Simulation 1' 230 and 'Simulation 2' 232. Each simulation 230, 232 has its own future events list and simulation-specific system state (including the states of each of the resident and transient entities in the simulation. However, there is a set of shared data, logic and functions indicated as 234 that is shared between the simulations 230, 232 including a partial shared system state 236 which is a subset of the overall simulation state of each of the simulations 230 and 232, standard code libraries 238, and other user-defined code blocks 240 shared between the simulations 230, 232. As the simulations execute, the shared information between them can be used to affect either Simulation 1 230 based on Simulation 2 232, or Simulation 2 232 based on Simulation 1 230. This can also affect the execution order of the events on either simulation 230, 232 since a shared code block is used across both simulations 230, 232.

Two independent carwashes example is demonstrated to exemplify the method illustrated in FIG. 5. These carwashes operate in the same city but are modeled as two independent simulations, with separate arrival processes and different operating times. Different statistics are maintained about the number of cars washed at each carwash, as well as their utilizations and number of cars waiting. However, if a car arrives at one carwash and that carwash is closed, it drives to the other carwash and enters the line at that carwash (if it is open). Such an approach can be used to model a plurality of simulations that are loosely linked and indirectly related to one another.

The foregoing description of the preferred embodiment of the present invention has been presented for the purpose of illustration and description. It is not intended to be exhaustive or to limit the invention to the precise form disclosed. Many modifications and variations are possible in light of the above teachings. It is intended that the scope of the present invention not be limited by this detailed description, but by the claims and the equivalents to the claims appended hereto.

We claim:

1. A method for discrete event simulation model of a system utilizing just-in-time compilation for at least one code block associated with at least one event in the discrete event simulation model, the method comprising the steps of:
    (a) determining the at least one event in the discrete event simulation model;
    (b) retrieving the at least one code block associated with the at least one event;
    (c) compiling the at least one code block into an object file (OBJ) using a compiler;
    (d) linking the object file with at least one predetermined function in a simulation library (LIB);
    (e) compiling the object file and the at least one predetermined function into a customized dynamic link library (DLL);
    (f) loading the customized dynamic link library within a discrete event simulation program execution;
    (g) linking the customized dynamic link library to a simulation program associated to the system; and
    (h) executing at least one user-entered logic in high speed by integrating a just-in-time compiler embedded into the discrete event simulation model to allow dynamic generation of high speed code blocks associated with the at least one event, the at least one user-entered logic being defined as a set of user-entered text that refers to system states and future events lists including a list of pending activities, a history of previously executed events or a previous system state at a previous moment of execution;
    whereby each at least one event has at least one event type, k, and for each k, a custom section of code is encapsulated inside a single function and compiled to a memory location to define the at least one code block, which is dynamically shared in the simulation program or other simulation programs executed within a context of an existing code block or other code blocks in a serial or recursive manner.

2. The method of claim 1 wherein the step of compiling the at least one code block occurs during the step of executing the at least one user-entered logic in high speed, and is linked to the discrete event simulation model via the DLL.

3. The method of claim 1 wherein the step of compiling the at least one code block performs the functions of an event execution in a discrete event simulation.

4. The method of claim 1 wherein the set of user-entered text describes logic or calculations to be performed as part of the at least one event.

5. The method of claim 1 wherein the system states include status of current resident or transient entities in the discrete event simulation model by means of a pre-determined syntax defined within the LIB and is accessible to the at least one code block and the DLL.

6. The method of claim 1 wherein the set of user-entered text includes any reference to data storage or other data that is part of the discrete event simulation model including current simulation time, stopping conditions of the discrete event simulation, and any other component of the discrete event simulation.

7. The method of claim 1 wherein the at least one predetermined function in the LIB and accessible to the DLL represents an entire collection of information generated within the discrete event simulation model including the system states and the future events list.

8. The method of claim 1 wherein the at least one code block has access to the system states, the future events list, other code blocks and a plurality of standard code libraries.

9. The method of claim 8 wherein the plurality of standard code libraries includes non-simulation-specific logic including math, statistical, logical and other functions.

10. The method of claim 1 wherein the at least one predetermined function in the LIB and accessible to the DLL further represents parameters defining the discrete event simulation model and other global functions including changing simulation time, scheduling future events and performing reporting functions.

11. The method of claim 1 wherein the custom section of code entered by the user is converted into a series of named sequences of machine code during the step of compiling the at least one code block into the object file using the compiler.

12. The method of claim 11 wherein the series of named sequences is provided with a unique identifier to distinguish the series of named sequences from other code blocks in the discrete event simulation model.

13. The method of claim 1 wherein the object file includes a series of sequences to perform a plurality of common tasks.

14. The method of claim 13 wherein the series of sequences is used by other code blocks in other sections of compiled code.

15. The method of claim 1 wherein the customized DLL is a programming object that is loaded at or during the step of executing the at least one user-entered logic in high speed, and is linked to the discrete event simulation model via the DLL.

* * * * *